United States Patent [19]

Belanger et al.

[11] Patent Number: 4,970,625
[45] Date of Patent: Nov. 13, 1990

[54] INTEGRATED MODULE HANDLE AND CHASSIS BULKHEAD FOR REDUCING ELECTROMAGNETIC INTERFERENCE EMISSIONS FROM CIRCUIT MODULES

[75] Inventors: Daniel L. Belanger, Westford; Ralph S. Dormitzer, Cohasset; David C. Moore, Pepperell; Donald G. Vonada, Stow; James M. Walls, Chelmsford, all of Mass.

[73] Assignee: Digital Equipment Corporation, Maynard, Mass.

[21] Appl. No.: 344,457

[22] Filed: Apr. 28, 1989

Related U.S. Application Data

[63] Continuation of Ser. No. 28,947, Mar. 23, 1987, abandoned.

[51] Int. Cl.$^5$ ............................................. H05K 9/00
[52] U.S. Cl. ................................. 361/424; 174/35 R; 361/212; 361/415
[58] Field of Search ............... 174/35 R, 35 MS File, 174/51; 361/392–395, 399, 415, 424, 422, 426, 212, 220; 455/90

[56] References Cited

U.S. PATENT DOCUMENTS

| | | | |
|---|---|---|---|
| 4,286,335 | 8/1981 | Aichler | 455/90 |
| 4,439,809 | 3/1984 | Weight | 361/220 |
| 4,531,176 | 7/1985 | Beecher, II | 361/212 |
| 4,546,407 | 10/1985 | Benenati | 361/415 |
| 4,631,641 | 12/1986 | Brombal | 174/35 R |
| 4,823,397 | 4/1989 | Hewitt | 455/90 |

*Primary Examiner*—Gerald P. Tolin
*Attorney, Agent, or Firm*—Kenyon & Kenyon

[57] ABSTRACT

A chassis and circuit modules for controlling electromagnetic interference in high-speed digital transceiver circuits. The impedance between a reference ground point and the transceiver circuits and a chassis wall through which the transceiver circuit signals pass is kept very low by intimate physical contact between a conductive bulkhead section of the module and the ground plane used by the transceiver. In particular, there is disclosed an arrangement whereby a plurality of modules are placed adjacent one another in a cabinet. Each of the modules contains a conductive bulkhead section or handle, which engages other adjacent bulkhead sections, and which may have an input/output connector mounted thereon. Each module also has a printed circuit board mounted to the bulkhead section so that a forward-circuit reference path reserved for use by transceiver circuits is positioned adjacent the connector and electrically connected to both the connector and the front section via a low impedance path. No partitions between the bulkhead sections are necessary since conductive springs formed on the lateral edges of the bulkheads provide electrical continuity between them.

17 Claims, 6 Drawing Sheets

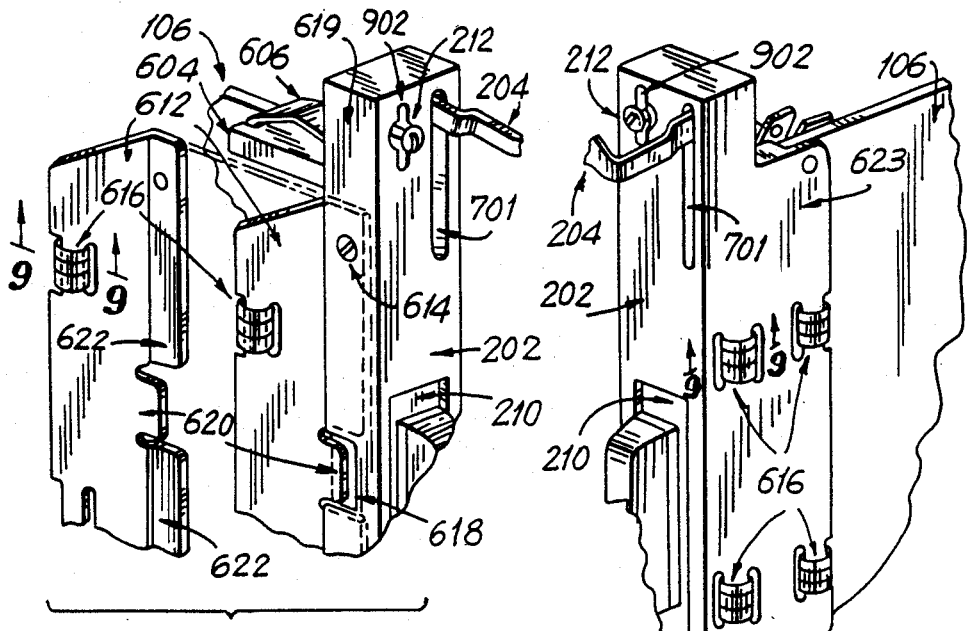
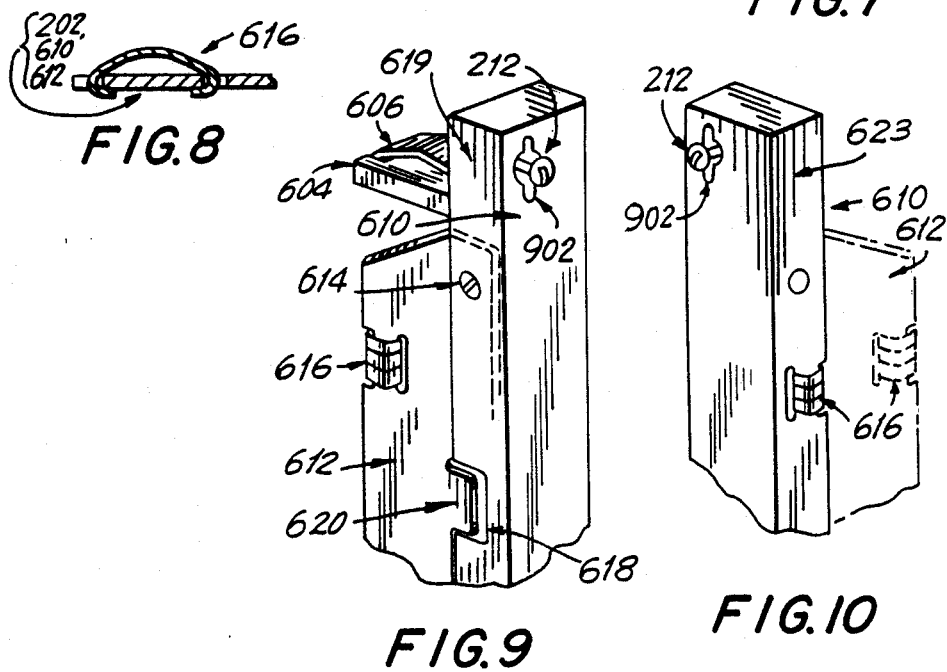

INTEGRATED MODULE HANDLE AND CHASSIS BULKHEAD FOR REDUCING ELECTROMAGNETIC INTERFERENCE EMISSIONS FROM CIRCUIT MODULES

This application is a continuation of application Ser. No. 07/028,947, filed Mar. 23, 1987, abandoned.

FIELD OF THE INVENTION

This invention relates to the field of reducing electromagnetic interference emission from digital circuit modules. The invention also relates to the field of shielding such circuit modules from externally generated electromagnetic interference, electrostatic discharges, or electrical overstress.

BACKGROUND OF THE INVENTION

High-speed digital circuits generate electromagnetic emissions that must be controlled. Such circuits thus are ordinarily contained in electrically conductive enclosures. However, electromagnetic interference ("EMI") emission is often introduced in the external environment by I/O circuit modules, i.e., circuit modules which transmit data to, or receive data from, a unit outside the enclosure. Such emission can interfere with proper operation of other electronic devices, such as computers, radio communications systems, or television receivers. The Federal Communications Commission ("FCC") has adopted regulations which set forth maximum acceptable limits on EMI emission from computer systems.

In addition to satisfying FCC standards for EMI emission, a computer system and its I/0 circuit module must be adequately protected against EMI from other sources, against electrostatic discharges ("ESD"), and against electrical overstress ("EOS"), all of which are or may be commonly present in the operating environment EMI reception can interfere with proper operation of the electronic components of a computer system. ESD and EOS may contain a wide spectrum of frequencies and can damage those electronic components due to excessive voltages, excessive currents, or both. EOS can introduce large voltages or large currents to the circuit module (as, for example, when I/0 connector cable is accidentally exposed to common 120 volt electric power lines).

To protect the environment against EMI emission from I/O circuit modules in a computer system and to protect the computer system against EMI, ESD and EOS from the environment, the circuitry is typically housed in a conductive cabinet. However, the cable that extends through the cabinet to the outside world is itself a source of EMI, and shielding is thus typically provided for the cable itself. The amount of this cabling can be reduced somewhat by filtering the output of the I/O circuit transceiver. But the best filters for this purpose tend to be expensive, while less-expensive filters, although effective for reducing EMI, also introduce into the cabinet interior circulating currents that can adversely affect the operation of the interior circuitry.

BRIEF DESCRIPTION OF THE INVENTION

The present invention reduces the need for filtering and shielding by using an integrated design for mounting, enclosing, and electrically connecting the I/O circuit modules in such a manner that the EMI generated by the I/O circuit modules is usually low enough to meet FCC standards without any substantial shielding. This integrated design also reduces the sensitivity of the I/O circuit modules to EMI reception from the environment.

According to the present invention, the mechanism by which much of the EMI is generated is eliminated. Specifically the impedance between the reference ("ground") point and the transmitter/receiver circuits and the cabinet wall, or bulkhead, through which transmitter/receiver signals pass is kept very low, typically by intimate physical contact between the bulkhead and the ground plane to which the transceiver is connected. This eliminates common-mode noise, generated by radiation inside the cabinet and currents drawn from other circuitry, that are two of the three main sources of EMI. The other source, which is the intended transmitter/receiver signal, can be controlled by controlling the signals that the system is intended to handle.

According to another aspect of the invention, a plurality of adjacent modules are disposed in a cabinet opening. Each of these modules includes a conductive bulkhead section (or handle) so that adjacent modules provide part of the cabinet bulkhead but there are no partitions between the bulkhead sections to insure that the enclosure remains radiation tight. Instead, conductive springs on the sides of the bulkhead sections engage adjacent bulkhead sections to provide electrical continuity between them. Since no partitions are needed, access to the cabinet interior is readily provided through the opening.

BRIEF DESCRIPTION OF THE DRAWINGS

FIG. 6 depicts a detachable spring connection plate and the way it attaches to one side of a circuit module handle.

FIG. 7 depicts the side of a circuit module handle to which the circuit module attaches.

FIG. 8 is a cross-sectional view, taken along the lines 9—9 shown in FIG. 6 and FIG. 7, of a contact spring which forms a mechanical and electrical connection between adjacent handles.

FIG. 9 depicts a detachable spring connection plate attached to one side of a blank handle.

FIG. 10 depicts a side of a blank handle on which contact springs are located.

DETAILED DESCRIPTION OF THE INVENTION

Figure 1:
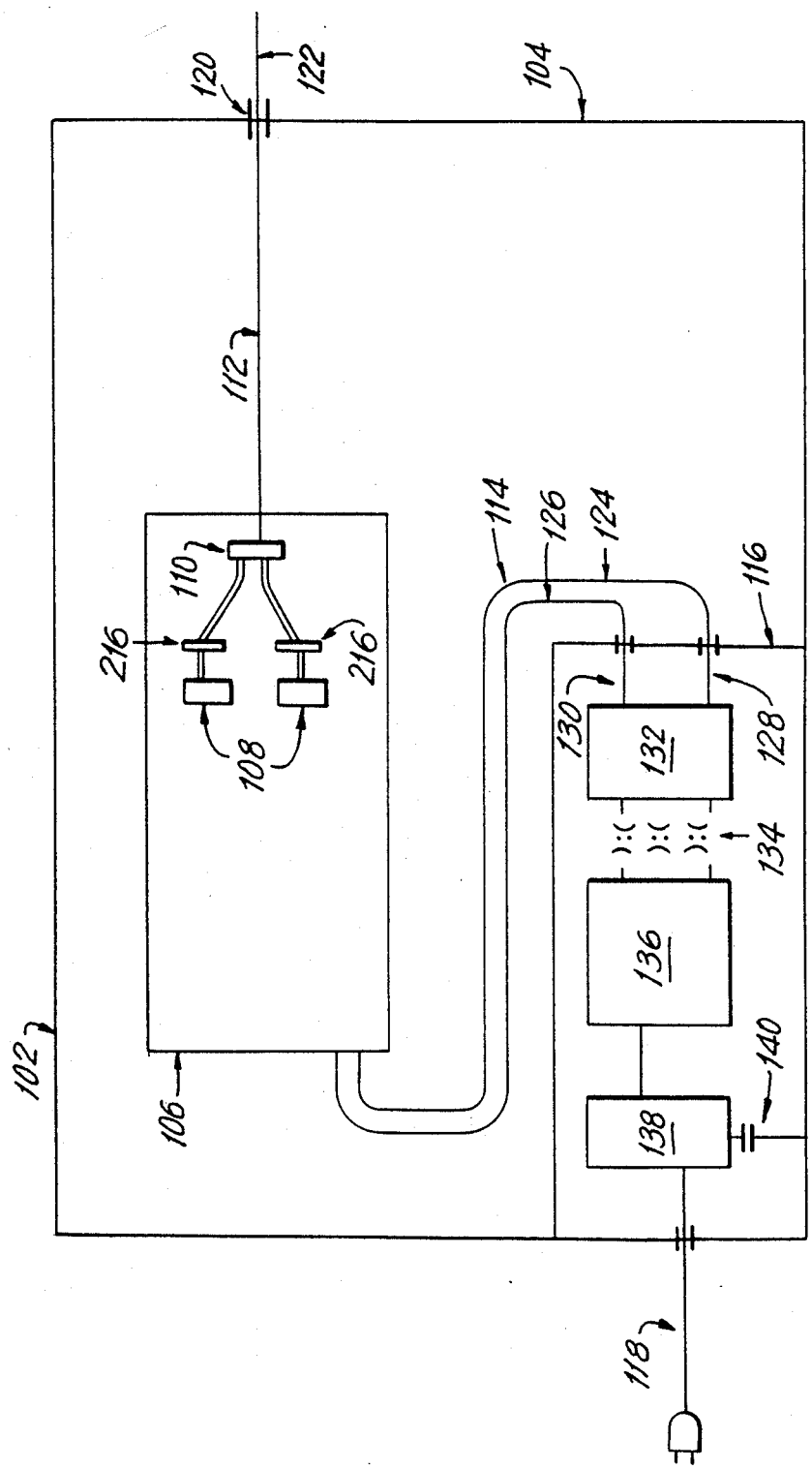
FIG. 1 depicts the generic prior art design for the enclosure for a prior art I/O circuit module.

FIG. 1 depicts a prior art generic enclosure design. An enclosure 102 having a front bulkhead 104 contains a circuit module 106, that includes input/output ("I/O") transmitting/receiving circuits 108. The enclosure 102 is typically a metal box, and the front bulkhead 104 is typically a metal sheet. The circuit module 106 typically includes a printed circuit board 109 on which various electronic components are mounted. A printed circuit board designed for high-frequency signals preferably contains a substantially planar layer of conductive metal (covered on both sides by a layer of an insulating material) which serves as a zero-volt reference plane to which the zero-volt reference terminals of most or all of the electronic components mounted on the printed circuit board are connected by very short conductive connections which pass through one of the insulating layers. While many printed circuit boards use etched lines as zero-volt reference connections, it is difficult to make etched lines with an impedance which is low enough so that such etched lines can act as zero-volt reference connections for high frequencies. A substantially planar layer, however, provides an electrical connection with low enough impedance to high-frequency signals to serve as a zero-volt reference.

The I/O driving/receiving circuits 108 are typically integrated circuits also having their zero-volt reference terminals connected to the zero-volt reference plane of the printed circuit board. There is no customary relationship in prior-art circuit modules between the location of the I/O driving/receiving circuits 108 and the location of the connector 120 on the front bulkhead 104; the I/O driving/receiving circuits 108 can be located almost anywhere on the printed circuit board. Moreover, the circuit module 106 can be located anywhere within the enclosure 102, its location bearing no general relationship to the front bulkhead 104 or the connector 120.

The I/O driving/receiving circuits 108 are typically connected to one side of a connector 110 (itself located somewhere on module 106). One end of an internal I/O cable 112 connects the other side of the connector 110 to a cable connector 120 mounted in the front bulkhead 104. An external I/O cable 122 provides a connection between the connector 120 and another unit (not shown).

A power supply 116 supplies power to the circuit module 106 for the electronic components mounted on it through a power supply connection 114. The power supply connection 114 has a power return line 124 and a power supply line 126. The power supply 116 receives its power through an external cable 118 from an external source of power (not shown). The power return line 124 connects the zero-volt reference plane of the circuit module 108 to the zero-volt reference terminal (or "ground") of the power supply 116. However, the zero-volt reference terminal of the power supply 116 is normally not directly referenced to the enclosure 102 or its front bulkhead 104. The power supply power line 126 connects the power terminal of the power supply 116 to conductive connections (typically metal lines) on the printed circuit board of the circuit module 106 for supplying power to the electrical components mounted on the printed circuit board.

The power supply 116 typically contains a regulator 132, to which power is supplied through a transformer 134 by a rectifier and switcher 136. The rectifier and switcher 136 receives its power through an FCC compliance filter 138 from external power cable 118. The FCC compliance filter 138 establishes a radio frequency reference with the enclosure 102 through a capacitor 140. The enclosure 102 is in turn electrically connected to the front bulkhead 104. The external power supply cable 118 is typically located remote from the front bulkhead 104.

In this prior art design a sometimes confusing array of cables can be present behind front bulkhead 104, particularly if more than one I/O circuit module is contained within the enclosure.

This typical configuration generates considerable EMI when the I/O driving/receiving circuits 108 are operating. A common-mode voltage $V_{com}$ exists between the zero-volt reference plane of the circuit module 106 and the front bulkhead 104. This develops a voltage $V_{com}$ on internal I/O cable 112 and the external I/O signal cable 122. Moreover, the internal I/O cable 112 acts as an antenna and tends to pick up EMI present within the enclosure 102; that EMI is conveyed through the connector 120 to the external cable 122.

The common mode voltage $V_{com}$ between front bulkhead 104 and external power supply cord 118 has two sources connected in series: a common mode voltage $V_{com}$(MOD) which exists across the zero-volt reference plane of the circuit module 106, and a common mode voltage $V_{com}$ (PS) which exists between the power return line 124 of the internal power connector cable 114 and the surface of the enclosure 102 (which includes the front bulkhead 104) $V_{com}$(MOD) exists on the circuit module 106 but becomes a potential difference between the front bulkhead 104 and the zero-volt reference plane of the circuit module 106 because the reference of the internal cable 112 connects to the reference of the I/O driving/receiving circuits 108.

However, between the point where the zero-volt references of the driving/receiving circuits 108 contact the zero-volt reference plane of the circuit module 106 and the points where the zero-volt references of other circuit elements located on the circuit module 106 contact the zero-volt reference plane of the circuit module 106, the zero-volt reference plane of the circuit module 106 has a non-zero impedance which can be approximately 2 milliohm. This impedance has a general tendency to increase with increasing frequency. The current flowing across this impedance from the zero-volt reference terminals of the driving/receiving circuits 108 to the power return line 124 of the internal power supply connection 114 can be as much as approximately 5 amperes. The voltage difference $V_{com}$(MOD) thus developed can thus be as much as approximately 10 millivolts; this voltage has a general tendency to increase with increasing frequency. The common mode voltage $V_{com}$(PS) between the power return line 124 in the internal power connection 114 (which is connected to the zero-volt reference plane of circuit module 106) and the enclosure 102 arises from the non-zero impedance and non-zero currents within power supply 116 between the return line 124 and the enclosure 102. These non-zero currents arise in part from switching noise between the return cable 124 and the point at which the filter 138 connects to the rectifier and switcher 136.

$V_{com}$(MOD) and $V_{com}$(PS) combine with the antenna effect of the internal signal cable 112 to generate EMI emission outside the enclosure 102. The external signal cable 122 both conducts EM? emissions to any device to which it is attached and radiates EMI emission into the environment. External signal cable 122 also conducts the frequencies $VC_{sig}$ which make up the signal which that cable is intended to convey to an attached device and tends to act as an antenna in radiating signals $VR_{sign}$ at those frequencies. Likewise, the total common mode voltage $V_{com} = V_{com}(PS) + V_{com}(MOD)$ is in part conducted as $VC_{com}$ and in part radiated as $VR_{com}$. Finally, any EMI present within the enclosure 102 and picked up by the internal signal cable 112 acting as an antenna also conducts on the external signal cable 122 as $VC_{ant}$ and tends to radiate from the external signal cable 122 as $VR_{ant}$.

When such voltages develop between the external signal cable 122 and the external power supply cord 118, the cable and the cord behave as a dipole antenna. In addition, the external signal cable 122 conducts the frequencies $VC_{com}$ and $VC_{ant}$ to any device to which that cable is attached and introduces those frequencies into that device. That device thus becomes yet another way in which EMI emissions may be radiated into the environment, and these unwanted frequencies $VC_{ant}$ and $VC_{com}$ may cause that device to fail to meet FCC EMI emission standards even if enclosure 102 and external signal cable 122 would, standing alone, meet such standards.

One typical prior art solution to these problems is to use a filter pin connector as the connector 120 between the internal I/O cable 112 and the external I/O cable 122. The filter pin connector typically contains inductors and capacitors chosen to block unwanted signals from being conducted from the internal I/O cable 112 to the external I/O cable 122 or vice versa and to block any EMI, ESD, and EOS from reaching the internal I/O cable 112. While filter pins thus adequately protect against EMI emission, ESD, and EOS, they are expensive. Moreover, their impedance has a general tendency to rise with increasing frequencies, so filter pins cannot be used with the high frequency signals needed for rapid data transfer.

Another typical prior art solution to these concerns involves shielding the internal I/O cable 112. The shielding for the internal I/O cable 112 is referenced either to the zero-volt reference plane of the circuit module 106 at or through connector 110, to front bulkhead 104, or to both, and filter pins are not used as the connector 120. Referencing the shield of the internal I/O cable 112 to the zero-volt reference plane of the circuit module 106 reduces $V_{ant}$ but provides no barrier to EMI going from or to the enclosure 102; there is no reduction of $V_{com}$, and $V_{ant}$ is not fully reduced. Moreover, such a design provides no ESD and EOS protection to the circuit module 106.

Referencing the shielding of the internal I/O cable 112 to the front bulkhead 104 but not to the zero-volt reference plane of the circuit module 106 also reduces $V_{ant}$ but leaves $V_{com}$ undiminished and provides no protection to circuit module 106 against incoming EMI.

If the shielding of the internal I/O cable 112 is referenced to both the zero-volt reference plane of the circuit module 106 and to the front bulkhead 104, $V_{com}$ is reduced by shorting $V_{com}$(MOD). However, this alternative introduces internal noise by providing a loop from the internal power supply return line 124 through the regulator 132, the rectifier/switcher 136, the FCC filter 138, the capacitor 140, and the enclosure 102 to the zero-volt reference plane of the circuit module 106.

A final variation typical of prior art is to shield the external I/O cable 122 and to reference that shield to the front bulkhead 104. This variation extends the concept of a radio-frequency tight enclosure (often referred to as a "Faraday shield") to encompass the external I/O cable 122. This eliminates all EMI emission by radiation from the external I/O cable 122 at the cost of requiring that any device to which the external I/O cable 122 is connected must be unaffected by any EMI conducted to it from the enclosure 102, not emit any such EMI into the environment, and not itself generate any EMI which would interfere with the operation of circuit modules contained inside the enclosure 102. Accordingly, both the enclosure 102 and any other device to which the external I/O cable 122 is connected must fully contain EMI, and the shielding of the external I/O cable 122 must also be fully adequate to contain EMI emissions. Such shielding is relatively expensive.

Figure 2:
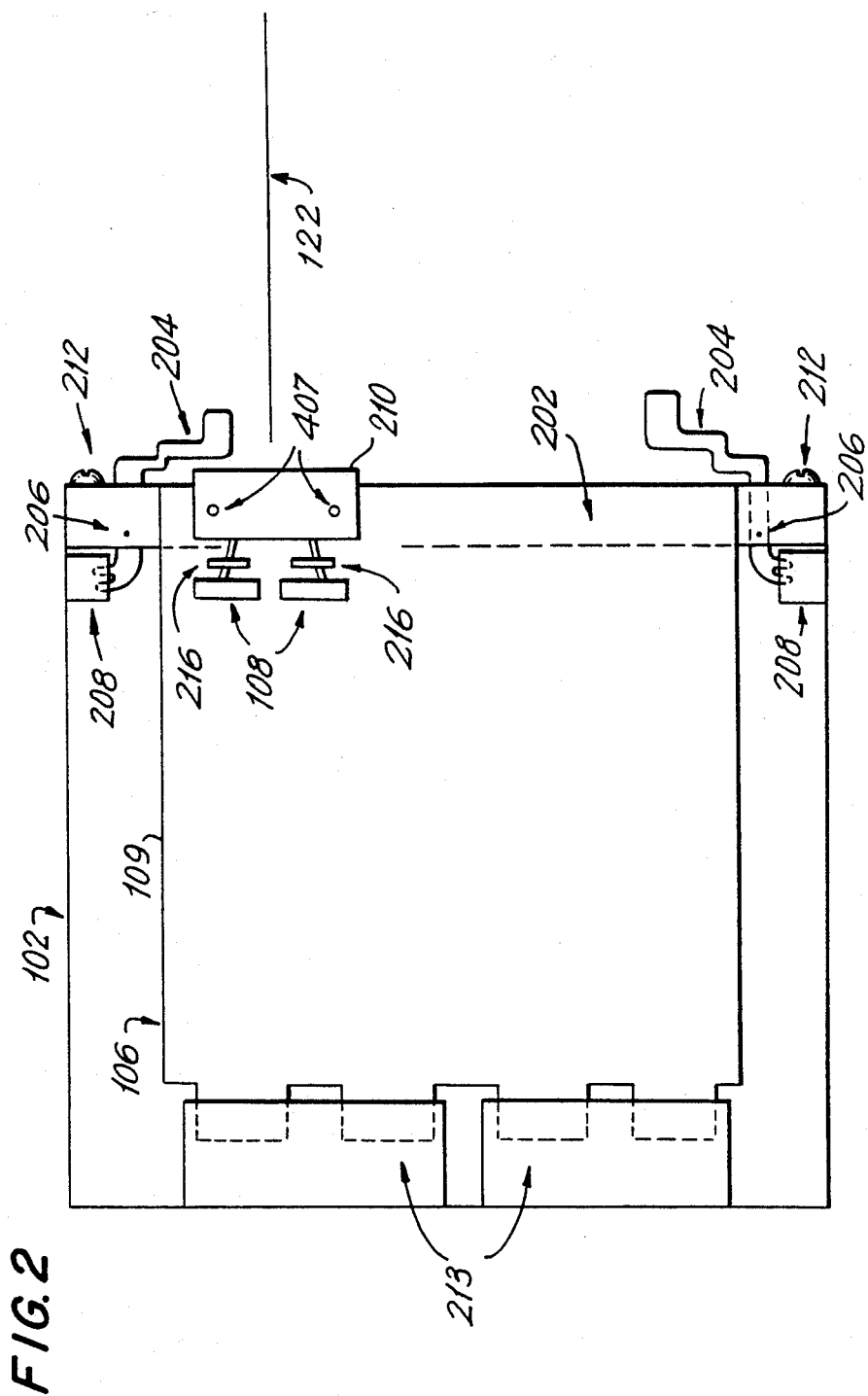
FIG. 2 depicts an embodiment of the present invention.

FIG. 2 depicts an integrated enclosure and circuit module according to the invention. The circuit module 106 includes a circuit board 109 and a metal bulkhead section handle 202 to which the module is mechanically attached. The module is removably insertable in enclosure 102, insertion and removal being aided by pivoted levers 204 mounted on the handle 202 by pivot pins 206. The levers 204 interact with slotted bars 208 to assist in inserting handle 202 with circuit module 106 attached into the correct position. A connector 210 for connecting the module circuitry to the external I/O cable 122 is mounted both in the handle 202 and on the printed circuit board 109 of the circuit module 106. The I/O driving/receiving circuits 108 are mounted on circuit module 106 close to connector 210; the transorbs 216 for the I/O driving/receiving circuits are located on the printed circuit board 109 between those circuits and connector 210. The zero-volt reference terminals of the I/O driving/receiving circuits 108 and the transorbs 216 are connected to the zero-volt reference plane of circuit module 106 near connector 210, and the zero-volt reference plane of circuit module 106 is also electrically connected to handle 202 at a point near connector 210. Power for the module is supplied by backplane connector 213.

In this enclosure according to the invention the cables which had been present in the prior art design are eliminated. Power is supplied to the circuit module through the backplane connector 213 rather than through a cable, and the internal I/O connector cable is eliminated. This substantially simplifies the task of properly inserting the circuit modules into the chassis enclosure.

Since the zero-volt reference plane is connected to the handle at a point near the connector 210, the impedance in the reference plane between the I/O circuits 108 and the enclosure is extremely low. This substantially eliminates antenna effects and the common-mode noise introduced by ground-return currents, so these significant sources of EMI are eliminated.

By providing a short, direct, low-impedance connection from the zero-volt reference terminals of I/O driving/receiving circuits 108 and their respective transorbs 216 to the metal handle, which is in turn connected to chassis 102 by a low-impedance connection, the invention provides a low-impedance path to the reference of the chassis (in parallel to the path across the zero volt reference of the circuit module) for the currents which flow through those zero-volt reference terminals. By making the impedance of this alternative pathway to the metal handle considerably lower than the impedance of the traditional pathway across the zero volt reference of the circuit module 106, the current from the zero volt references of I/O transmitting/receiving circuits 108 and their transorbs 216 will be largely diverted from flowing across the zero volt reference of circuit module 106. The zero-volt reference terminals of other circuit elements located on circuit module 108 are connected to that zero-volt reference. Accordingly, the invention also isolates those other circuit elements from potentially disruptive changes in the reference of their zero-volt terminals due to currents flowing from the references of the I/O driving/receiving circuits 108 and their respective transorbs 216.

This connection to the metal handle can be improved by providing on either side or on both sides of the printed circuit board a relatively broad conductive metal strip to which the surface of the metal handle can be mechanically attached so as to form a low-impedance electrical connection between that strip and the surface of the metal handle. Such metal strips can assist in connecting the reference terminals of I/O driving/receiving circuits 108 and their respective transorbs 216 to the surface of the metal handle.

Figure 3:
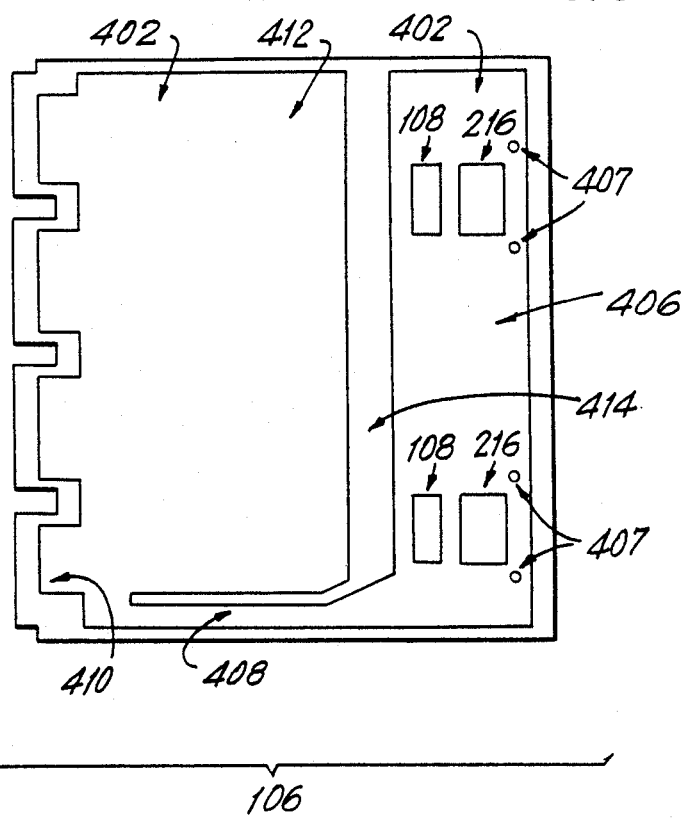
FIG. 3 depicts the configuration of the zero-volt reference plane of a printed circuit board for an I/O circuit module designed according to the present invention.

This separation of the I/O driving/receiving circuit and transorb return currents from the return reference of the other circuit elements mounted on circuit module 106 can also be improved by providing a separate zero-volt return path for the references of those components. FIG. 3 shows the zero-volt reference plane 402 of a typical circuit module 106. I/O driving/receiving circuits 108 and their associated transorbing devices 216 are referenced to a portion 406 of reference plane 402. Intimate physical contact between portion 406 and the handle 202 is provided through connector 407 at points near the connector 210 (FIG. 2) that connect the interior reference plane 402 to a lip (to be described below) on the handle. Portion 406 also connects through arm 408 to the location 410 near which the a reference conductor from an associated internal power supply (not shown) connects to the circuit module 106 when module 106 engages backplane 213 (FIG. 2), analogous to the reference conductor 124 described in connection with FIG. 1. Area 406 is in turn connected by a short, low-impedance electrical connection to metal handle 202 and its I/O connector 210, which are also mechanically attached to circuit module 106. A remaining portion 412 of reference plane 402 serves as the reference plane for the various logic components mounted on circuit module 106 in the area above or below area 412. A gap 414 in reference plane 402 separates area 406 from area 412 and separates most of arm 408 from area 406. Arm 408 connects to area 412 only near power supply reference connection point 410.

This configuration helps to divert any transient currents which flow to the zero-volt reference plane 402 in the area 406 from the zero-volt references of I/O driving/receiving circuits 108 and transorbs 216 from affecting the zero-volt reference of the various logic components mounted on circuit module 106 above area 412 with their zero-volt terminals referenced to area 412. A substantial portion of such currents should flow to the metal handle 202 and through that metal handle to the chassis reference. However, any small portion of such currents which flows into area 406 will flow through arm 408 and area 410 through the backplane connector 213 to the reference conductor of the internal power supply connection 114 and will not flow across area 412. Thus, the currents which flow through the zero-volt reference terminals of the logic circuits mounted on circuit module 106 will have a substantially reduced chance of affecting the zero-volt reference level of I/O driving/receiving circuits 108.

Figure 4:
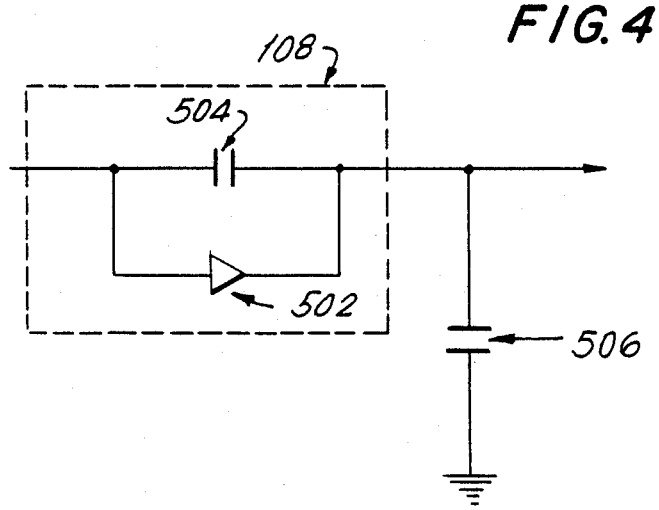
FIG. 4 depicts an equivalent circuit of an I/O transmitting circuit and a shunt capacitor according to the present invention.

While protection against EMI, ESD, and electrical overstress ("EOS") is provided by transorbing devices 216, a further reduction in EMI emissions from the circuit module 106 results from adding a small capacitor between the transmission lines of I/O driving/receiving circuits 108 and the zero-volt reference of circuit module 106. As shown in FIG. 4, each I/O driving/receiving circuit 108 behaves as if it were an amplifier 502 in parallel with a small capacitor 504. This small capacitance 504 is apparently due to coupling between the transmitting line and the receiving line when those two functions are combined in a single transmitting/receiving circuit 108. While capacitance 504 is in most cases too small to affect transmission or reception of signals by the I/O transmitting/receiving circuits 108, capacitor 504 can forward high-frequency components that cause EMI, which would ordinarily not be forwarded by amplifier 502. To prevent that small capacitance 504 from forwarding EMI-causing signal components, the invention adds a further capacitor 506 between the module output terminal and the zero-volt reference of I/O driving/receiving circuit 108. The two capacitors form a voltage divider, and, since capacitor 506 is selected to be many (as much as approximately 1000) times the inherent capacitance 504 of I/O driving/receiving circuit 108, the high-frequency components are greatly attenuated. Since the inherent capacitance 504 of I/O driving/receiving circuit 108 is usually very small (often of the order of 0.1 picofarad), capacitor 506 may also be very small and can be chosen to achieve a desired reduction in the power of high frequency EMI forwarded to the transmitting line. For example, if capacitance 504 is approximately 0.1 picofarad, choosing a 100 picofarad capacitor as capacitor 506 should achieve approximately a 30 decibel reduction in the high-frequency EMI which can pass through transmitting/receiving circuit 108 (typically of the order of 100 picofarads). Such a small capacitance for capacitor 506 does not create the disadvantages of typical filter pins and should not interfere with transmitting desired signals over external I/O cable 122.

Figure 5:
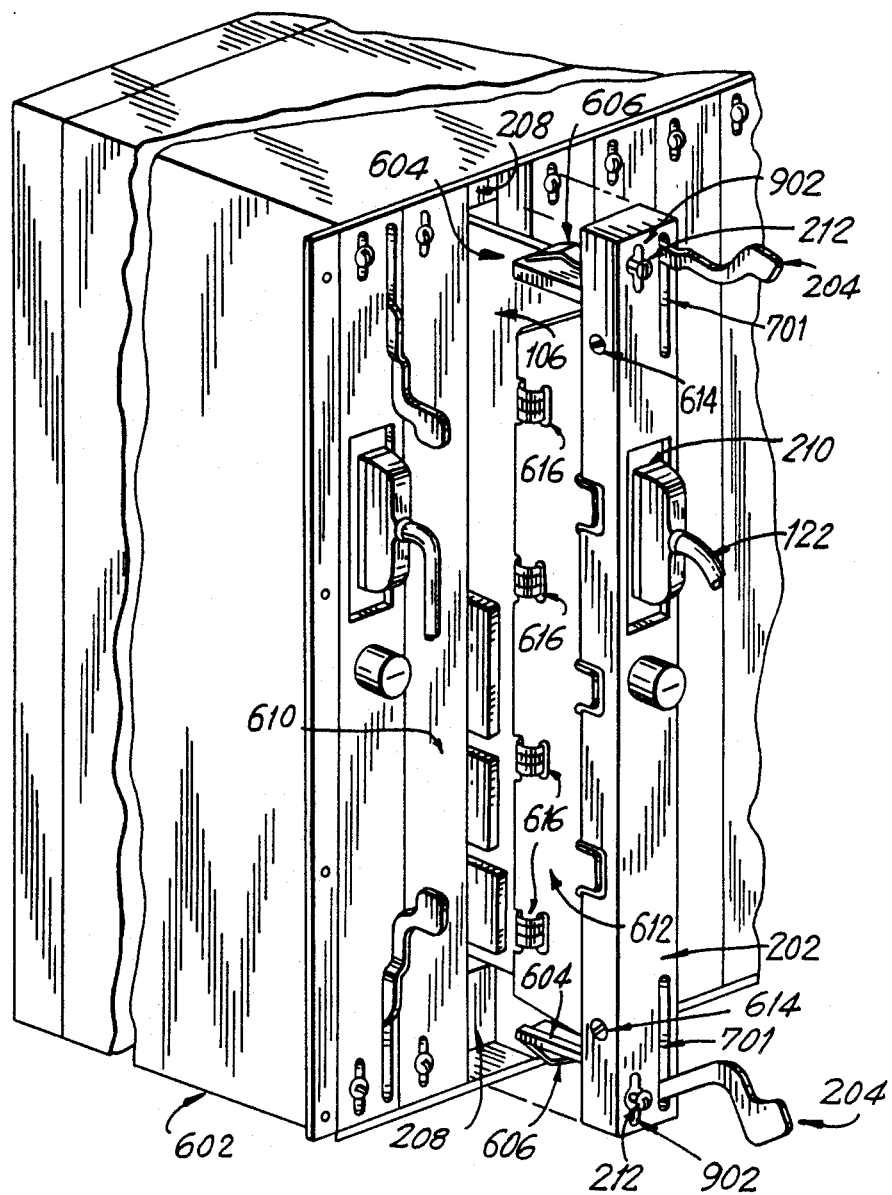
FIG. 5 depicts the chassis of an integrated housing according to the present invention, showing the effect of the I/O circuit module handles and of blank handles in forming the front bulkhead surface of the integrated containment housing.

The foregoing advantages of the present invention are most easily achieved by providing a chassis into which circuit modules 106 and the handles 202 to which they are mechanically attached can be mounted. FIG. 5 depicts a fragmentary view of such a chassis.

In FIG. 5 a handle 202 with a circuit module 106 mechanically attached is shown in the process of being inserted into or removed from the front of chassis 602.

Other handles such as handle 202 may also be mounted in chassis 602. Moreover, blank handles such as blank handle 610 are mounted in chassis 602 wherever there is no need for a handle (such as handle 202) having an I/O connector 210 for attachment to an external I/O connector cable 122. The entire front surface of chassis 602 will thus be filled with either handles like handle 202, which provide for connecting an external I/O cable 122, blank handles such as blank handle 610, or recessed handles such as described below.

Handle 202 is equipped with pivoted levers 204 which interact with slotted bars 208 to assist in inserting handle 202 into, or removing handle 202 from, its location in chassis 602. Handle 202 is also equipped with attachment pins 212, which interact with slotted bars 208 to attach or detach handle 202 from chassis 602 when handle 202 has been properly inserted into chassis 602 using pivoted levers 204. I/O connector cable 122 attaches to I/O connector 210, which is mounted in handle 202 to permit such attachment. Handle 202 has projecting bars 604, on which are mounted metal springs 606. When handle 202 is properly inserted into chassis 602, springs 606 contact a surface of slotted bars 208.

To provide additional space at the front of the integrated chassis of the invention for attaching external I/O cables 122 to I/O connectors 210, it may be desirable to recess a portion of a handle such as handle 202 back from the space it would otherwise occupy. This recess is made in the area of a handle such as handle 202 between the ends of the handle on which the pivoted levers 204. Such a recessed handle has pivoted levers 204 and attached pins 212 in the same location as those items are present on a handle 202.

To close the spaces which would exist if a recessed handle were installed adjacent to a handle 202 a detachable spring connector plate 612 is provided for attachment to a handle 202 or to a blank handle 610. This plate 612 provides both electrical closure and mechanical closure of that space. One side of handle 202 is equipped with a detachable spring connector plate 612 which is attached to handle 202 by screws 614. Plate 612 is equipped with springs 616 which are positioned so that when handle 202 is properly inserted in chassis 602, springs 616 will make contact with an adjacent side of a handle such as a recessed handle.

The surfaces of handles 202 and 610, the surfaces of slotted bar 208, and springs 606 and 616 are chosen so that springs 606 and 616 make very good electrical contact between the surfaces of handles 202 and 610 and slotted bar 208 or adjacent handles. Handles 202 and 610, slotted bar 208 and springs 606 and 616 must from a network of electrical connections which has a low impedance at all frequencies up to the frequencies which can pass through the maximum slot dimension S described above. Moreover, this network of electrical connections must be capable of carrying (at least for a brief period) the currents of up to several hundred amperes which can flow through the handles under EOS conditions. In the preferred embodiment handles 202 and 610, springs 606 and 616, and slotted bars 208 are all of metal with a highly conductive surface.

FIG. 6 shows a detail of the way in which a detachable spring connector plate 612 attaches to a handle such as handle 202. Depressions 618 in a side lip 619 the side of handle 202 accommodate tongues 620 in detachable spring connection plate 612. The tongues 620 and flanges 622 on the spring connection plate form a slot that receives the side lip 619.

This mating of a plate 612 with a side of handle 202 helps to assure a firm electrical contact between the surfaces of plate 612 and the surface of the side of a recessed handle when plate 612 is mounted on the handle 202. Two screws 614 secure plate 612 to handle 202.

FIG. 7 depicts the lip 623 opposite lip 619 (as shown in FIG. 6) and illustrates the mechanical attachment of the circuit module 106 to that opposite lip 623. To provide proper insertion depth for inserting the attached module into the backplane connector, lip 623 extends farther than lip 619 does. Lip 623 is equipped with contact springs 616 mounted in slots in handle 202 in each a manner as to maintain good electrical contact with the surface of handle 202. Contact springs 616 are adapted to form mechanical contact and good electrical contact with a lip of any handle adjacent to handle 202 (or with an adjacent side wall of chassis 602 if this side of handle 202 is adjacent to such a side wall). Moreover, contact springs 616 on a spring connection plate 612 are adapted to make mechanical and good electrical contact with the surface of the extended side of a recessed handle when a handle (such as a handle 202 or a blank handle 610) to which a detachable spring connection plate 612 has been attached is adjacent to a recessed handle.

FIG. 8 is a detailed view of springs 616 taken at line 9—9 of FIG. 7 of the way in which contact springs 616 fit in slots in a spring connection plate 612 and in a handle such as a handle 202.

As shown in FIGS. 9 and 10, a blank handle 610 may also be equipped with the same detachable spring connection plate 612 as may be mounted on a handle 202. A blank handle 610 has the same depression 618 as a handle 202 and the same provision for receiving a mounting screw 614. A blank handle 610 also has corresponding, similarly located mounting ridges 604, springs 606, and attachment pins 212 so that blank handle 610 can be removably inserted into and attached to chassis 602 wherever a handle 202 can be inserted and attached.

By comparing FIGS. 6 and 7 it can be seen that when two handles 202 are inserted adjacent to each other in chassis 602, springs 616 on one handle will contact a lip of the other handle. If a handle 202 is inserted adjacent to a recessed handle, either the second row of springs on the extended lip of handle 202 will contact a surface of the recessed handle, or springs 616 on a detachable spring connection plate 612, attached to the right handle 202, will contact a surface of the recessed handle. In this way a firm mechanical connection and a good electrical connection will be established between the handle 202 and the recessed handle by the springs 616.

As shown in FIG. 10, the other side of a blank handle 610 is equipped with springs 616 mounted in slots just as handle 202 is equipped.

Moreover, by comparing the views of a handle 202 shown in FIGS. 6 and 7 with the blank handle 610 of FIGS. 9 and 10, it can be seen that a blank handle 610 may be inserted in chassis 602 on either side of a handle 202. If a blank handle 610 is inserted immediately to the right of a recessed handle, the left side of blank handle 610 should be equipped with a detachable spring connection plate 612 so that the springs 616 in that detachable spring connection plate will contact a surface of the recessed handle. When a blank handle 610 is inserted to the left of a recessed handle, the right side of the blank handle 610 should likewise be equipped with a detachable spring connection plate 612.

Finally, it is apparent from FIGS. 9 and 10 that, when two blank handles 610 are inserted adjacent to each other, the springs 616 mounted on the right side of one handle 610 will make mechanical and good electrical contact with the left side of the other blank handle 610.

FIGS. 11–15 depict in further detail the way in which the pivoted levers 204 assist in inserting a handle 202 into, or removing a handle 202 from, chassis 602. The pivoted levers 204 are pivotably attached to a projection from the interior surface of handle lip 623. One end of pivoted lever 204 extends through a slot 701 in the surface of handle 202 and forms an arm used in inserting handle 202. The other end of pivoted lever 204 has two prongs 702 and 704 separated by a notch. Prongs 702 and 704 are adapted to fit around a narrow bar 706 remaining in support bar 208 after areas of support bar 208 have been formed in manufacturing. When one has inserted the handle 202 into the chassis 602, he turns each of the two levers 204 so that the levers 204 pivot to the position shown in FIG. 12. As it pivots, prong 702 acts against bar 706 to move handle 202 into position in chassis 602. The handle 202 is then retained in the proper position by the attachment pin 212, as will be described in more detail below. To remove the handle 202, one disengages the attachment pin 212 and pivots the lever 204 from the position shown in FIG. 12 to the position shown in FIG. 11, and prong 704 acts against bar 706 to urge handle 202 away from its position in chassis 602.

Figure 11:
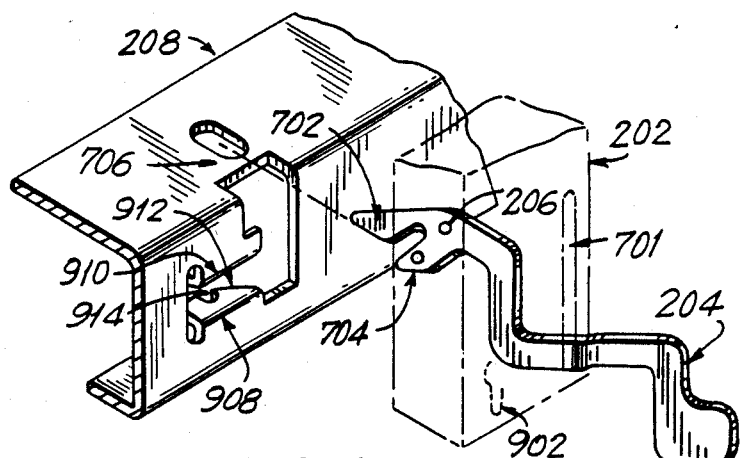
FIG. 11 depicts a pivoted lever used to assist in inserting a circuit module into, or removing a circuit module from, the connector mounted on the backplane in the chassis.
Figure 12:
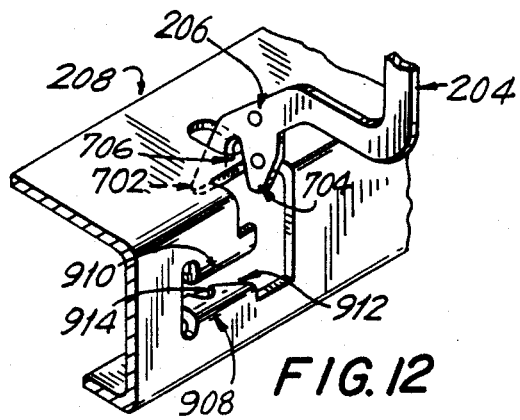
FIG. 12 depicts the interaction between the lever and a cross-bar incorporated in the chassis.
Figure 13:
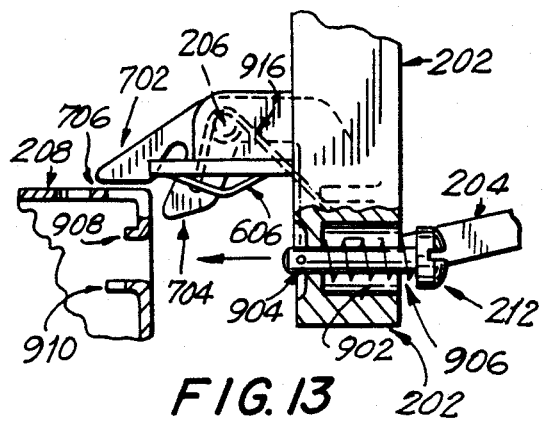
FIG. 13 depicts a mechanism for attaching a handle to, or detaching a handle from, the cross-bar incorporated in the chassis after the handle has been inserted into the chassis.

FIG. 13 depicts the way attachment pin 212 connects with support bar 208 to attach a handle 202 to chassis 602. Attachment pin 212 is mounted in a recess 902 in handle 202. As shown in FIG. 5, recess 902 has an elongated opening through which a cross bar 904 attached to the inner end of attachment pin 212 can pass. After crossbar 904 is inserted through handle 202, attachment pin 212 is rotated so that crossbar 904 no longer mates with the elongated opening in handle 202. A spring 906 pushes attachment pin 212 away from handle 202 and urges crossbar 904 against mating surfaces 908 and 910 formed on support bar 208. As shown in FIG. 11, mating surface 908 has a slanted cam portion 912 on the right side of a notch 914, while edge 910 has a corresponding notch that registers with notch 914 but has a cam surface on the left, rather than on the right, side of its notch. The two cam surfaces bear against the crossbar 904 when the attachment pin is rotated, so the pin is pulled against the spring bias until the crossbar seats in the two registering notches.

Figure 14:
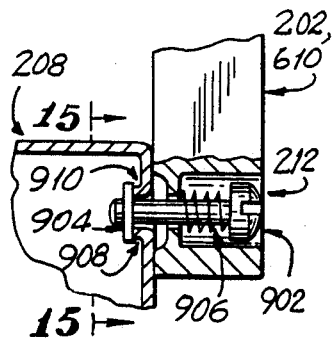
FIG. 14 depicts the mechanism for attaching a handle to, or detaching a handle from, the chassis when that mechanism has been used to attach the handle to the chassis.
Figure 15:
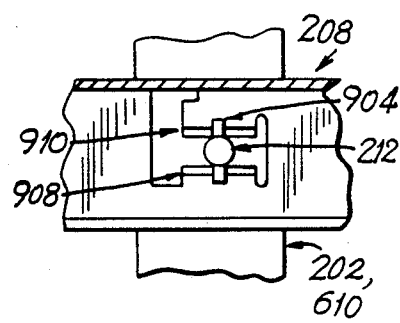
FIG. 15 is a view, taken along the line 15—15 shown in FIG. 14, of the attachment mechanism when that mechanism has been used to attach the handle to the chassis.

When the crossbar 904 is thus seated in the notch, handle 202 is secured to support bar 208 and thus to chassis 602 by good mechanical contact. FIG. 14 depicts the position of these components in a side view after handle 202 is so secured; and FIG. 15 is a cross section taken at line 16—16 of FIG. 14.

FIG. 13 also shows spring 916, one end of which contacts prong 704 of pivoted lever 204, and the other end of which contacts handle 202. Spring 916 is under compression and tends to urge prong 704 against ridge 706 so as to properly orient the lever 204 so that it will fit properly into support bar 208 when the handle is inserted into the chassis. This proper orientation is desirable because the mating of the prongs on pivoted 204 with the support bar 208 cannot be observed from the front of the chassis while the handle is being inserted into the chassis. Spring 916 thus opposes a rotation of pivoted lever 204 which would tend to urge prong 702 against ridge 706.

In the preferred embodiment pivoted lever 204, attachment pin 212, crossbar 904, spring 906, and spring 916 are all made of metal and all have conductive surfaces. The many points of surface-to-surface mechanical contact between these items thus may also provide good electrical contact between these items. However, the primary basis of electrical connection among handles and between each handle and the chassis is provided by the springs 606 and 616, which are specifically selected according to techniques, known to those skilled in the art, to make low-impedance electrical connections.

This network of good electrical contacts forms a barrier to EMI emission from chassis 602 into the environment and shields the interior of chassis 602 against receiving EMI from the environment. These electrical contacts also furnish a path for ESD and EOS from the environment to the chassis 602 and thus protect the electrical components mounted on circuit module 106 from damage due to environmental ESD and EOS.

From FIG. 5 it will be apparent that the connection of each handle 202 or 610 with its adjacent handles does not extend continuously through the entire height of the handle. Slots of maximum length S are left between the springs 616, and radiation can propagate in either direction through these slots. As is well known, an electromagnetic wave with wavelength approximately equal to or less than approximately 4S propagates easily through a slot of length S, while an electromagnetic wave with wavelength approximately equal to or greater than 8S does not propagate easily through a slot of length S. Accordingly, the maximum slot dimension S between springs should be small enough to prohibit appreciable EMI transmission at wavelengths which would either (a) cause an enclosure to fail FCC EMI emissions standards or (b) permit EMI which would interfere with the operation of circuit components withIn an enclosure to enter the enclosure from the environment.

The network of good electrical contacts between the surfaces of the handles also provides a low-impedance pathway from the area of any one handle at which an external connector cable is attached to the area of any other handle at which another external connector cable is attached. If the shielding of such external connector cables is referenced to the metal handle, the low-impedance connections will prevent any significant voltage difference between the shields of such connector cables and thus will prevent any current from circulating in loops through the connector cable shields.

The power supply for the enclosure is located at the side of the chassis and provides both a source and return line to the backplane; the source and return lines connect to the circuit modules through the backplane connector. The housing of the power supply is also connected by low-impedance connections to the portion of the chassis on which the handles are mounted and is thus connected to the handles by a low impedance electrical connection.

The foregoing description has been limited to a specific embodiment of the invention. It will be apparent, however, that variations and modifications may be made to the invention, with the attainment of some or all of the advantages of the invention, and that the invention may be made in other ways. Therefore, it is the object of the appended claims to cover all such varia-

What is claimed as new and desired to be secured by Letters Patent of the United States of America is:

1. An electronic circuit assembly comprising:
   A. an electromagnetically conductive enclosure, the enclosure having a front opening;
   B. a plurality of circuit modules, said modules inserted through the front opening of the enclosure, the circuit modules forming an electromagnetic shield together with the enclosure when the modules are inserted, each circuit module comprising:
      i. a metallic handle having an input/output signal connector;
      ii. means for providing mechanical and electrical coupling between the handle and enclosure when the circuit module is inserted into the enclosure;
      iii. a circuit board mechanically mounted to the handle, having a voltage reference plane, the circuit board also having both a transceiver circuit and other types of circuits, each circuit type having a reference terminal;
      iv. means for providing a low impedance electrical path between the handle and the transceiver circuit reference terminal, diverting a reference current flowing through the transceiver circuit reference terminal away from the reference plane of the circuit board;
   C. the voltage reference plane being divided into a first position and a second portion, the first and second portions being electrically separated by a gap and coupled only along an arm, the low impedance electrical path additionally comprises:
      i. means for electrically coupling the transceiver circuit reference terminal only to the first portion of the reference plane;
      ii. means for electrically coupling the other types of circuits' reference terminals only to the second portion of the voltage reference plane; and
      iii. means for providing intimate physical contact between the first portion of the voltage reference plane and the handle.

2. The electronic circuit assembly as in claim 1 wherein the low impedance electrical path additionally comprises:
   d. means for coupling the first portion of the voltage reference plane, through the arm, to a zero-volt reference lead of a power supply.

3. The electronic circuit assembly as in claim 1 wherein the means for providing intimate physical contact between the first portion of the reference plane and the handle is a conductive strip formed along each side of the module.

4. An electronic circuit assembly comprising:
   A. an electromagnetically conductive enclosure, the enclosure having a front opening;
   B. a plurality of circuit modules, said modules inserted through the front opening of the enclosure, the circuit modules forming an electromagnetic shield together with the enclosure when the modules are inserted, each circuit module comprising:
      i. a metallic handle having an input/output signal connector;
      ii. means for providing mechanical and electrical coupling between the handle and enclosure when the circuit module is inserted into the enclosure;
      iii. a circuit board mechanically mounted to the handle, having a voltage reference plane, the circuit board also having both a transceiver circuit and other types of circuits, each circuit type having a reference terminal; and
      iv. means for providing a low impedance electrical path between the handle and the transceiver circuit reference terminal, diverting a reference current flowing through the transceiver circuit reference terminal away from the reference plane of the circuit board;
   c. the means for providing mechanical and electrical coupling between the handle and enclosure when the circuit module is inserted into the enclosure comprising:
      a. a lever pivotably attached to a projection from an interior surface of the handle, the lever having a prong on its interior end, and
      b. a slotted bar formed on the periphery of the enclosure and shaped to engage the prong of the lever.

5. The electronic circuit assembly as in claim 4 additionally comprising:
   c. means for retaining the handle in position against the enclosure.

6. The electronic circuit assembly as in claim 4 additionally comprising:
   c. an attachment pin mounted in a recess formed in the periphery of the handle, the recess having an elongated opening, the attachment pin having a cross-bar, the crossbar sized to fit through the elongated opening, the crossbar attached to an inner end of the attachment pin and a spring disposed to urge the pin away from the handle; and
   d. a mating surface formed in the periphery of the enclosure adjacent a point where the attachment pin is positioned near the enclosure when the circuit module is inserted, the mating surface having a cam surface disposed to bear against the crossbar when the attachment pin is rotated to secure the handle to the enclosure.

7. An electronic circuit assembly comprising:
   A. an electromagnetically conductive enclosure, the enclosure having a front opening;
   B. a plurality of circuit modules, said modules inserted through the front opening of the enclosure, the circuit modules forming an electromagnetic shield together with the enclosure when the modules are inserted, each circuit module comprising:
      i. a metallic handle having an input/output signal connector;
      ii. means for providing mechanical and electrical coupling between the handle and enclosure when the circuit module is inserted into the enclosure;
      iii. a circuit board mechanically mounted to the handle, having a voltage reference plane, the circuit board also having both a transceiver circuit and other types of circuits, each circuit type having a reference terminal;
      iv. means for providing a low impedance electrical path between the handle and the transceiver circuit reference terminal, diverting a reference current flowing through the transceiver reference terminal away from the reference plane of the circuit board; and
      v. means for providing electrical coupling between the periphery of the handle and adjacent handles when the circuit modules are positioned inside the enclosure, the electrical coupling such that a low impedance is provided at all electromagnetic radiation frequencies up to a maximum frequency radiated by the circuit modules.

8. The electronic circuit assembly as in claim 7 wherein the means for providing electrical coupling between the handle and adjacent handles comprises:
   e. a spring connector plate attached along an inner peripheral portion of the handle so as to couple the handle of an adjacent circuit module when the circuit modules are positioned inside the enclosure, the spring connector plate having slots formed and spaced therealong; and
   f. a plurality of metallic contact springs mounted in the slots formed in the spring connector plate.

9. An electronic circuit assembly comprising:
   A. an electromagnetically conductive enclosure, the enclosure having a front opening;
   B. a plurality of circuit modules, said modules being inserted through the front opening of the enclosure, the circuit modules forming an electromagnetic shield together with the enclosure when the modules are inserted in the enclosure, each circuit module comprising:
      i. a front metallic bulkhead section;
      ii. means for providing mechanical and electrical conduct between the bulkhead section and the enclosure when the circuit module is inserted into the enclosure, comprising:
         a. a lever pivotably attached to a projection formed on an interior surface of the bulkhead section, the lever having a prong on its interior end;
         b. a slotted bar formed on the periphery of the enclosure and shaped to engage the prong of the lever;
         c. an attachment pin mounted in a recess formed in the periphery of the bulkhead section, the recess having an elongated opening, the attachment pin having a crossbar, the crossbar sized to fit through the elongated opening, the crossbar attached to an inner end of the attachment pin and a spring disposed to urge the pin away from the bulkhead section; and
         d. a mating surface formed in the periphery of the enclosure adjacent a point where the attachment pin is positioned near the enclosure when the circuit module is inserted, the mating surface having a cam surface disposed to bear against the crossbar when the attachment pin is rotated to secure the bulkhead section to the enclosure.

10. An electronic circuit assembly comprising:
    A. an electromagnetically conductive enclosure, the enclosure having a front opening;
    B. a plurality of circuit modules, said modules inserted through the front opening of the enclosure, the circuit modules forming an electromagnetic shield together with the enclosure when the modules are inserted, each circuit module comprising:
       i. a metallic handle having an input/output signal connector;
       ii. means for providing mechanical and electrical coupling between the handle and enclosure when the circuit module is inserted into the enclosure;
       iii. a circuit board mechanically mounted to the handle, having a voltage reference plane, the circuit board also having both a transceiver circuit and other types of circuits each circuit type having a reference terminal;
       iv. means for providing a low impedance electrical path between the handle and the transceiver circuit reference terminal, diverting a reference current flowing through the transceiver circuit reference terminal away from the reference plane of the circuit board; and
       v. a capacitor connected between an input/output terminal of the transceiver circuit and the transceiver circuit reference terminal, the capacitance of the capacitor being much greater than the inherent capacitance of the input/output terminal of the transceiver circuit.

11. An electronic circuit assembly comprising:
    A. an electromagnetically conductive enclosure, the enclosure having a front opening;
    B. a plurality of circuit modules, the modules being inserted through the front opening of the enclosure, the circuit modules forming an electromagnetic shield together with the enclosure when the modules are inserted in the enclosure, at least one of the plurality of circuit modules comprising:
       i. a front metallic bulkhead section;
       ii. an electrical connector integrally mounted on the front metallic bulkhead section;
       iii. a printed circuit board mechanically mounted to the module, the printed circuit board comprising a plurality of circuits including a transceiver circuit, the transceiver circuit located on the printed circuit board in close proximity to the front metallic bulkhead section to minimize the impedance between the transceiver circuit and the electrical connector wherein the printed circuit board includes a zero volt reference plane which comprises a substantially planar layer of conductive metal surrounded on both sides by an insulating material, the zero volt reference plane is coupled to a zero volt reference of each of the plurality of circuits.

12. The electric circuit assembly as in claim 11 wherein at least a second one of the plurality of circuit modules comprises:
    i. a front metallic bulkhead section; and
    ii. a printed circuit board mechanically mounted to the module.

13. An electronic control circuit assembly comprising:
    A. an electromagnetically conductive enclosure, the enclosure having a front opening;
    B. a plurality of circuit modules, the modules being inserted through the front opening of the enclosure, the circuit modules forming an electromagnetic shield together with the enclosure when the modules are inserted in the enclosure, each circuit module comprising:
       i. a front metallic bulkhead section;
       ii. an electrical connector integrally mounted on the front metallic bulkhead section;
       iii. a printed circuit board mechanically mounted to the module, the printed circuit board having a zero volt reference plane which comprises a substantially planar layer of conductive metal surrounded by both sides by an insulating material, the zero volt reference plane coupled to the front metallic bulkhead section; and iv. means for maintaining intimate mechanical and electrical contact between the integrally mounted electrical connector and a signal cable coupled to the electrical connector to preserve the EMI boundary to reference radiation generated internal to the enclosure to the zero volt reference plane and independently reference radiation generated from external sources to the enclosure.

14. An electronic circuit assembly comprising:
A. an electromagnetically conductive enclosure, the enclosure having a front opening;
B. a plurality of circuit modules, the modules being inserted through the front opening of the enclosure, the circuit modules forming an electromagnetic shield together with the enclosure when the modules are inserted in the enclosure, each circuit module comprising:
   i. a printed circuit board mechanically mounted thereto, each printed circuit board having:
      (1) a zero volt reference plane which comprises a substantially planar layer of conductive metal surrounded on both sides by an insulating material; and
      (2) a transceiver circuit and other types of circuits, each having a zero volt reference coupled to the zero volt reference plane; and
   ii. a circuit module handle having a zero volt reference coupled to the zero volt reference plane of each printed circuit board, the zero volt reference of the circuit module handle further coupled to the enclosure by a plurality of low impedance positioning springs providing intimate mechanical and electrical contact.

15. An electric circuit assembly comprising:
A. an electromagnetically conductive enclosure, the enclosure having a front opening;
B. a plurality of circuit modules, the modules being inserted through the front opening of the enclosure, the circuit modules forming an electromagnetic shield together with the enclosure when the modules are inserted in the enclosure, each circuit module comprising:
   i. a front metallic bulkhead section; and
   ii. a plurality of metallic positioning springs having low impedance providing:
      (a) mechanical and electrical contact between the front metallic bulkhead section and the enclosure,
      (b) an electrical path to a safety reference to divert electrical overstress sourced external to the enclosure away from the circuit modules, the electrical path comprising the front metallic bulkhead section intercoupled with the plurality of metallic positioning springs and the electromagnetically conductive enclosure,
      (c) mechanical and electrical contact between the front metallic bulkhead section and an abutting circuit module; and
   iii. a printed circuit mechanically mounted to the module, the printed circuit board having a zero volt reference plane which comprises a substantially planar layer of conductive metal surrounded on both sides by an insulating material, the zero volt reference plane is coupled to the front metallic bulkhead section;

16. The electronic circuit assembly as in claim 15 wherein the plurality of metallic positioning springs comprise:
   i. upper and lower metallic positioning springs providing an intimate mechanical and electrical contact with the enclosure;
   ii. sideplate metallic positioning springs located on both sides of each circuit module to form an intimate mechanical and electrical contact with an abutting circuit module; and
   iii. sideplate metallic positioning springs located on both sides of the circuit module to form an intimate mechanical and electrical contact with the enclosure.

17. An electronic circuit assembly comprising:
A. an electromagnetically conductive enclosure, the enclosure having a front opening; and
B. a plurality of circuit modules, the modules being inserted through the front opening of the enclosure, the circuit modules forming an electromagnetic shield together with the enclosure when the modules are inserted in the enclosure, each circuit module comprising:
   i. a front metallic bulkhead section;
   ii. means for providing mechanical and electrical contact between the metallic bulkhead section and the enclosure;
   iii. means for providing an intimate electrical contact between the circuit module and abutting circuit modules while maintaining a low impedance at all electromagnetic radiation frequencies up to a maximum frequency radiated by the circuit modules;
   iv. means for providing mechanical and electrical contact between the metallic bulkhead section and an abutting circuit module;
   v. means for providing an intimate electrical contact between the circuit module and the enclosure while maintaining a low impedance at all electromagnetic radiation frequencies up to a maximum frequency radiated by the circuit modules; and
   vi. a printed circuit board mechanically mounted to the module, the printed circuit board having a zero volt reference plane which comprises a substantially planar layer of conductive metal surrounded on both sides by an insulating material, the zero volt reference plane is coupled to the front metallic bulkhead section.

* * * * *